United States Patent
Saeki et al.

[11] Patent Number: 5,822,573
[45] Date of Patent: Oct. 13, 1998

[54] CLOCK GENERATOR FOR A MICROPROCESSOR HAVING A DELAY EQUALIZATION CIRCUIT

[75] Inventors: Takanori Saeki; Yukio Fukuzo, both of Tokyo, Japan

[73] Assignee: NEC Corporation, Tokyo, Japan

[21] Appl. No.: 724,826

[22] Filed: Oct. 2, 1996

[30] Foreign Application Priority Data

Oct. 5, 1995 [JP] Japan .................................. 7-258704

[51] Int. Cl.⁶ ...................................................... G06F 1/04
[52] U.S. Cl. .......................................................... 395/558
[58] Field of Search ............................................. 395/558

[56] References Cited

U.S. PATENT DOCUMENTS 5,359,727  10/1994  Kurita et al. ..................... 595/558 X
5,426,772   6/1995  Brady ................................. 395/558
5,446,867   8/1995  Young et al. ....................... 395/558

OTHER PUBLICATIONS

I.A. Young, et al.,"A PLL Clock Generator With 5 to 110 MHz of Lock Range for Microprocessors", IEEE Journal of Solid–State Circuits, vol. 27, No. 11, Nov. 1992, pp. 1599–1607.

*Primary Examiner*—Thomas M. Heckler
*Attorney, Agent, or Firm*—Ostrolenk, Faber, Gerb & Soffen, LLP

[57] ABSTRACT

A clock generator of the present invention comprises a first buffer receiving a first clock, a second buffer receiving a second clock having a amplitude being different of that of the first clock, phase comparator comparing phases between an output of the first buffer and an output of the second buffer, and means for adapting a delay time of the first buffer to a delay time of the second buffer.

11 Claims, 3 Drawing Sheets

CLOCK GENERATOR FOR A MICROPROCESSOR HAVING A DELAY EQUALIZATION CIRCUIT

BACKGROUND OF THE INVENTION

The present invention relates to a clock generator, and more particularly to a clock generator designed on high-clock frequency microprocessors.

A microprocessor clock generator is based upon an analog phase-locked loop (PLL). A conventional clock generator is described in IEEE JOURNAL OF SOLIDSTATE CIRCUIT VOL. 27, NO. 11, 1992. FIG. 1 is a block diagram showing a conventional clock generator based upon a PLL. This PLL circuit is composed of an input buffer 102, a phase comparator 104, a loop filter 105, a voltage-controlled oscillator 106, an internal clock buffer 107 and an internal clock input buffer 103. Further, this PLL circuit is formed on one chip. Thus, the input buffer 102 and the internal clock input buffer 103 are formed of the same circuit configuration. An external clock 100 is generated in another chip of the semiconductor device. The phase comparator 104 receives an external clock 100 and an internal clock 101 to the phase comparator 104 through the input buffer 102 and the internal clock input buffer 103, respectively. Further, the phase comparator 104 detects a phase difference between the external clock 100 and the internal clock 101, and inputs the difference signal to the voltage-controlled oscillator 106 through the loop filter 105. Then, the voltage-controlled oscillator 106 controls an oscillation frequency. As a result, the PLL circuit is operated so that the phase difference between the external clock 100 and the internal clock 101 disappears.

As a semiconductor integrated circuit device becomes high in speed, the amplitude of the external clock 100 generated outside this chip has become smaller in recent years. For example, the amplitude width of the external clock 100 is approximately 1.7 V. On the other hand, the internal clock 101 oscillates at an amplitude equivalent to power supply voltage inputted to this chip, e.g., at an amplitude width of approximately 3.3 V. A problem arises that a difference is generated in delay time of the input buffers 102 and 103 which receives two input signals having different amplitudes. FIG. 2 shows the relationship between the delay time of the internal clock input buffer 103 and the input buffer 102 and the power supply voltage applied to the chip. The axis of abscissa indicates the power supply voltage of the chip including this PLL circuit, and the axis of ordinate indicates the delay time of the input buffer 102 and the internal clock input buffer 103, respectively. As it is apparent from FIG. 2, when there is a difference in amplitude between the signals 100 and 101 inputted to respective input buffers 102 and 103, the delay time of respective input buffers becomes different. As described, there has been a problem that, as the delay time the respective buffers is different, a phase difference is generated between the external clock 100 and the internal clock 101 even when the phase difference of outputs between the input buffer 102 and the internal clock input buffer 103 disappears. Furthermore, the delay time of the internal clock input buffer 103 becomes shorter when the power supply voltage is raised because the amplitude of the clock 101 is equal to the power supply voltage, thus the delay time difference from the input buffer 102 is increased further.

SUMMARY OF THE INVENTION

It is an object of the present invention to resolve the phase difference between an external clock and an internal clock.

A clock generator of the present invention comprises a first buffer receiving a first clock, a second buffer receiving a second clock having a amplitude being different of that of the first clock, a phase comparator comparing phases between an output of the first buffer and an output of the second buffer, and means for adapting a delay time of the first buffer to a delay time of the second buffer.

A clock generator of a second embodiment of the present invention comprises a first buffer spending a first delay time to convert a first clock having a first amplitude to the first clock having a second amplitude, a second buffer spending a second delay time to convert a second clock having a third amplitude to the second clock having the second amplitude, a phase comparator comparing phases between the first clock having the second amplitude and the second clock having the second amplitude, and an amplitude conversion circuit spending a third delay time to convert the second clock having the second amplitude to the second clock having the third amplitude and controlling said third delay time so that an addition of the second delay time of the second buffer and the third delay time of the amplitude conversion circuit is equalized to the first delay time of the first buffer.

A clock generator of a third embodiment of the present invention comprises a first buffer spending a first delay time to convert a first clock having a first amplitude to the first clock having a second amplitude, a second buffer spending a second delay time to convert a second clock having a third amplitude to the second clock having the second amplitude, a phase comparator comparing phases between the first clock having the second amplitude and the second clock having the second amplitude and generating a control pulse based on the phase difference of the first clock and the second clock, a loop filter generating control voltage based on the control pulse, a voltage-controlled oscillator producing the second clock having the second amplitude in accordance with the control voltage, a clock buffer amplifying the second clock having the second amplitude outputted from the voltage-controlled oscillator to drive a circuit, and an amplitude conversion circuit converting the second clock having the second amplitude to the second clock having the third amplitude.

With the above-mentioned structure, it is possible to vary the amplitude of the second clock so as to make this amplitude the same as that of the first clock. Thus, the delay time of the second clock buffer for receiving the second clock and the delay time of the first clock buffer for receiving the first clock become equal to each other.

BRIEF DESCRIPTION OF THE DRAWINGS

The above and other objects, advantages and features of the present invention will be more apparent from the following descriptions to be read in conjunction with the accompanying drawings, in which.

DETAILED DESCRIPTION OF THE PREFERRED EMBODIMENTS

Figure 3:
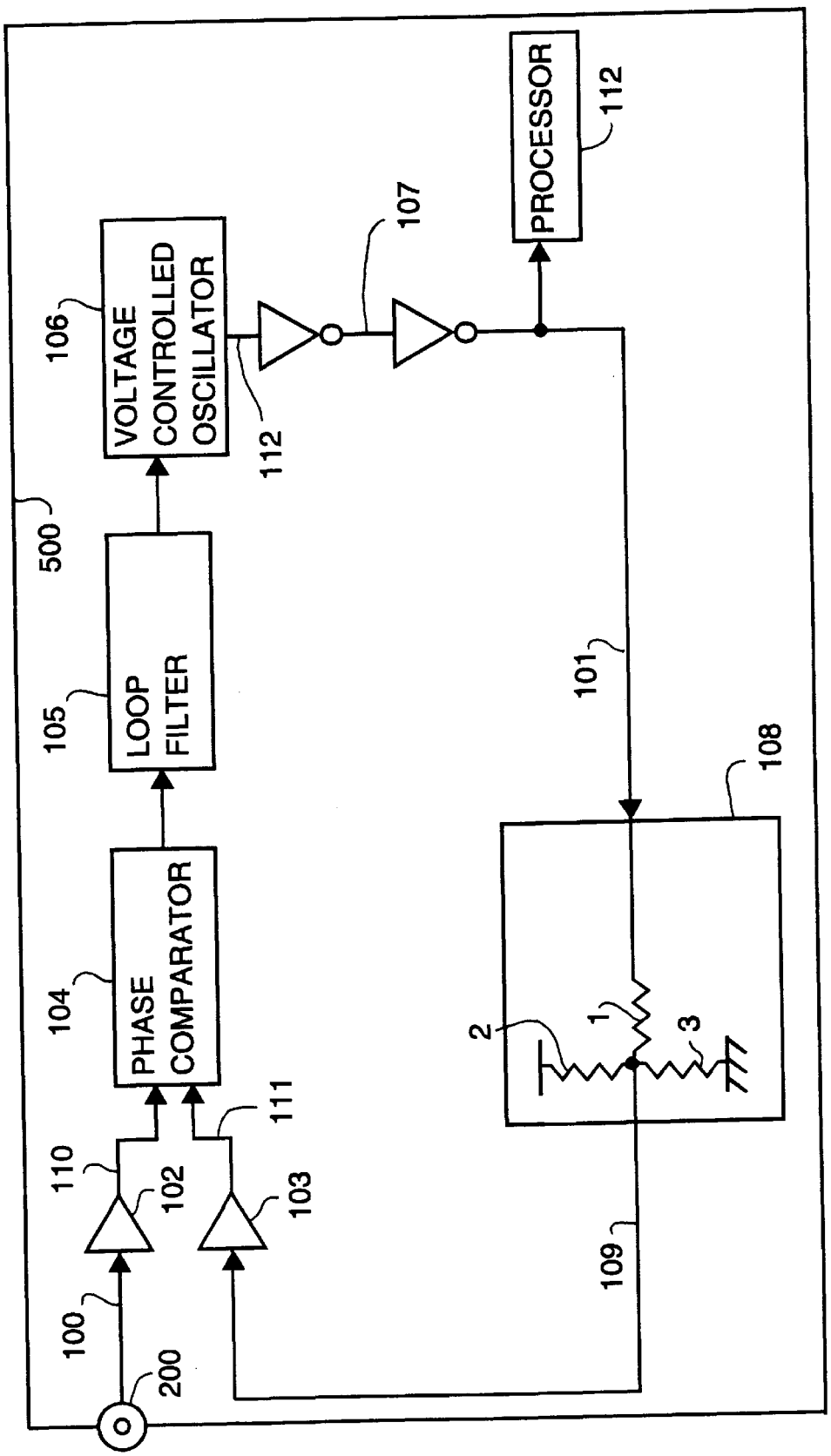
FIG. 3 is a block diagram showing a clock generator of the present invention.

Referring now to FIG. 3, a clock generator (PLL circuit) of the present invention is contained on a semiconductor chip 500. The PLL circuit receives an external clock 100 through an external clock input terminal 200 and inputs the clock 100 to an input buffer 102 as a first buffer. The external clock 100 has a small amplitude, for example, 1.7 V. The input buffer 102 amplifies the clock 100 to a clock 110 having a CMOS level, for example, an amplitude of 3.3 V. The input clock buffer 102 needs a delay time to convert the clock 100 to the clock 110. A phase comparator 104 compares the phases of the output of input buffer 102, that is, clock 110, with the phase of the output of an internal clock input buffer 103, that is, a clock 111. The phase comparator 104 generates a control pulse based on the phase difference between the clock 110 and the clock 111. A loop filter 105 generates a control voltage based on the control pulse. A voltage-controlled oscillator (VCO) 106 receives the control voltage outputted from the loop filter 105 and outputs a clock 112 having a CMOS level. The internal clock buffer 107 receives the clock 112 outputted from VCO 106 and amplifies the clock 112 to produce an internal clock 101 enough to be able to drive internal circuits, for example, a processor 112. A internal clock buffer is formed of a CMOS circuit. The internal clock 101 is a CMOS level, for example, amplitude of 3.3 V. An amplitude-conversion circuit 108 receives the internal clock 101 and converts the internal clock 101 to a clock 109. The amplitude of the clock 109 is smaller than that of the internal clock 101. The amplitude-conversion circuit 108 has a delay time to convert the clock 101 to the clock 109. However, the delay time of the amplitude-conversion circuit 108 is smaller than that of input buffer 102 and internal clock buffer 103 discussed later. Accordingly, it is considered that the amplitude-conversion circuit 108 does not have a delay time itself. The internal clock input buffer 103 receives the clock 109. The internal clock input buffer 103 is the same circuit configuration as the input buffer 102. Accordingly, the internal clock input buffer amplifies the clock 109 to a clock 111 having a CMOS level, for example, an amplitude of 3.3 V width.

The amplitude-conversion circuit 108 of the present invention is composed of resistance 1 provided in a path between the internal clock buffer 107 and the internal clock input buffer 103, and resistances 2 and 3 provided in a path between on side of the resistance 1 and the internal clock input buffer 103 and provided in series between power supply voltage and ground voltage. The value of the resistances 2 and 3 are made essentially equal. Accordingly, the clock 109 swings between power supply voltage and ground voltage. Since this circuit 108 is very simple, the delay time of the circuit 108 is very short. For the sake of convenience, the delay time of the buffer 102, buffer 103, and amplitude-conversion circuit 108 are delay 1, delay 2, and delay 3 respectively.

Accordingly, a time needed to convert the external clock 100 into the clock 110 is the delay 1 of the buffer 102. On the contrary, a time to be needed to convert the internal clock 101 into the clock 111 is the addition of the delay 2 and delay 3 of the buffer 103 and amplitude-conversion circuit 108.

Figure 1:
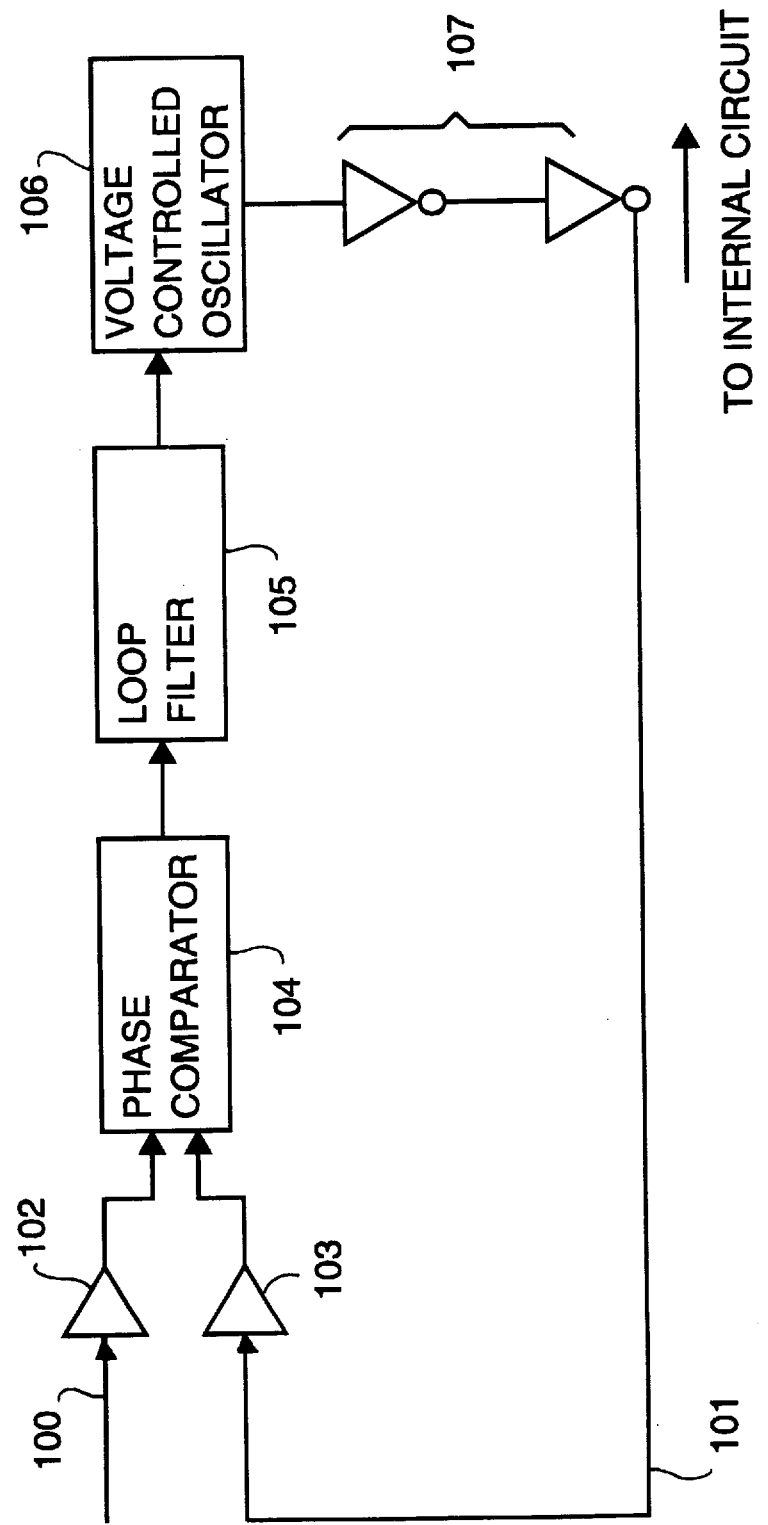
FIG. 1 is a block diagram showing a conventional clock generator.
Figure 2:
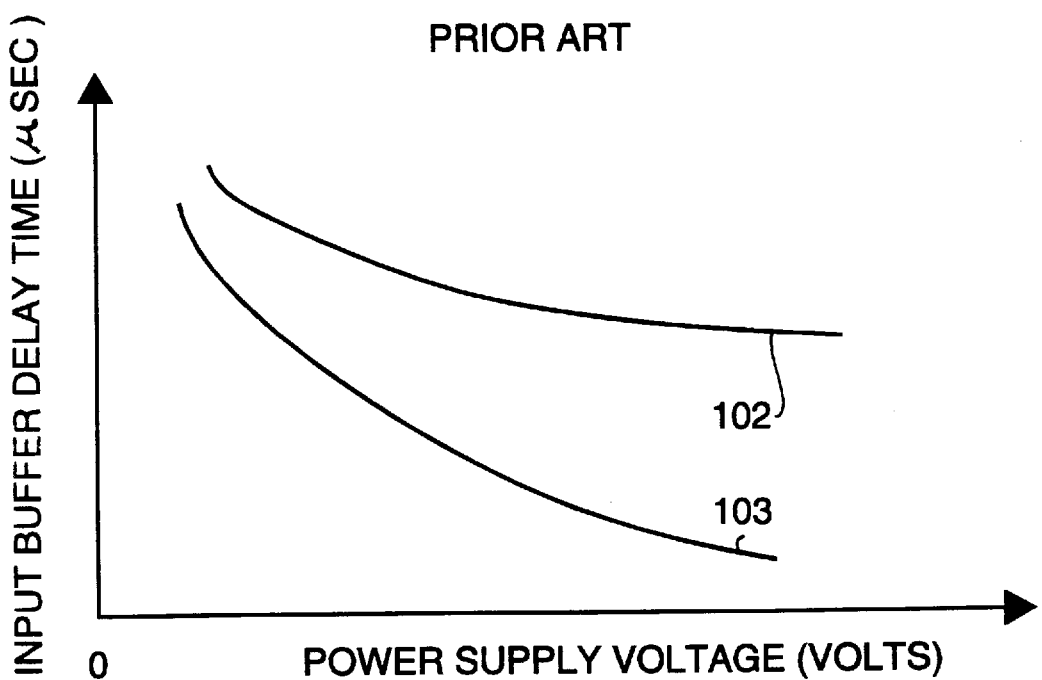
FIG. 2 is a diagram showing the conventional relationship between input buffer delay time and power supply voltage.
Figure 4:
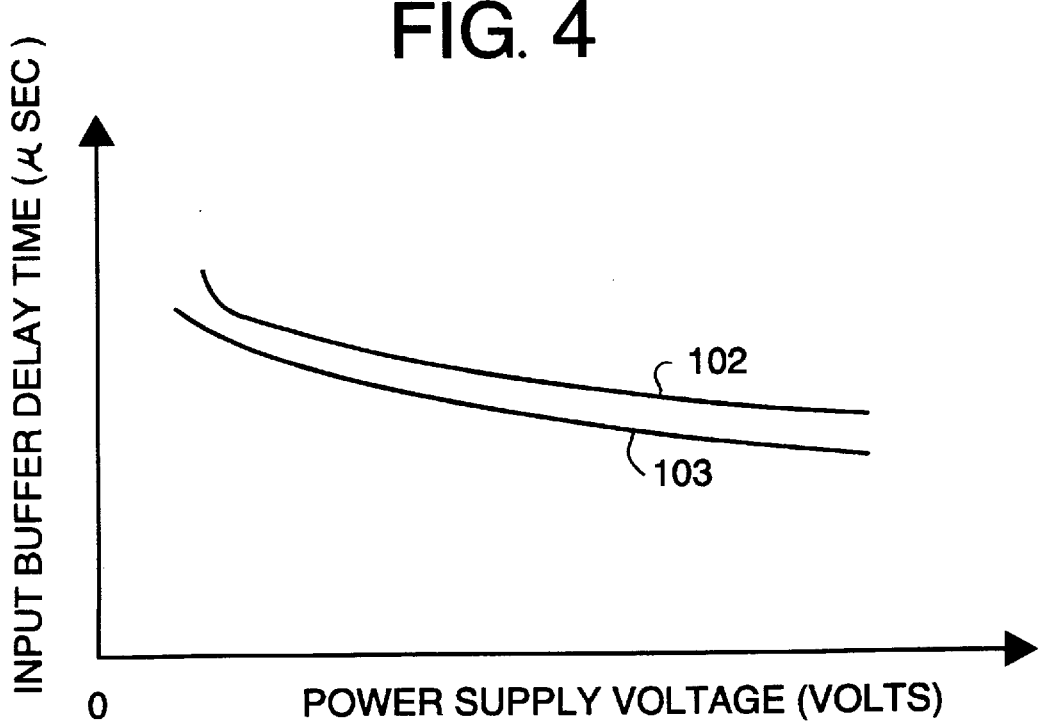
FIG. 4 is a diagram showing the relationship between the input buffer delay time and power supply voltage according to the present invention.

Referring to FIG. 2, the larger the amplitude of an input clock received by the input buffers 102, 103, the smaller the delay time of the input buffers 102, and 103. The smaller an amplitude of the input signal received by the input buffers 102, and 103 the larger the delay time of the input buffers 102, and 103. Accordingly, the amplitude-conversion circuit 108 is controlled so that the amplitude of the clock 109 is established to be the amplitude of the external clock 100 and the internal clock 101, for example, an amplitude of 1.9 V. Accordingly, referring to FIG. 4, the delay time of the input buffer 103 is set to be somewhat less than that of the input buffer 102. The difference of the delay time of the input buffer 102 and the delay time of the input buffer 103 is the delay time of the amplitude-conversion circuit 108. Accordingly, since the delay time to be needed to covert the external clock 100 into the clock 110 and the delay time to be needed to covert the internal clock 101 into the clock 111 is almost same time, the PLL circuit can adjust the phase of the internal clock 101 to the phase of the external clock 100. Furthermore, since the amplitude of the external clock 100 and the amplitude of the clock 109 are made almost equal to each other, the delay time in respective input buffers gets shorter, but no difference is produced even when the power supply voltage is raised.

Furthermore, the amplitude-conversion circuit 108 is actually considered not to have a delay time since the structure of its circuit is more simple than the buffer 102 and 103. Accordingly, the amplitude-conversion circuit 108 is controlled so as to convert the internal clock 101 into the clock 109 having the amplitude almost the same as the external clock 100 such as the amplitude of 1.7 V. Since the amplitude of the clock 109 becomes equal to the amplitude of the external clock 100, the input buffer delay time of the input buffer 102 and the internal clock input buffer 103 becomes almost equal to each other. Therefore, the clock generator of the present invention can adjust the phase of the internal clock 101 to the phase of the external clock 100.

As described above, according to the present invention, it is possible to make the amplitude of a clock entering the internal clock input buffer 103 nearly equal to a small external clock amplitude by arranging an amplitude-conversion circuit 108 between the internal clock buffer 107 and the internal clock input buffer 103. As a result, it is possible to almost eliminate the difference between the delay time of the internal clock input buffer 103 and the delay time of the external clock input buffer 102, thereby, to eliminate the phase difference between the external clock 110 and the internal clock 101.

The invention has been shown and described with reference to specific embodiment. However, it should be noted that the present invention is in no way limited to the details of the illustrated structures but changes and modifications may be within the scope of the appended claims. For example, the internal clock 101 and the external clock 100 does not need to be same frequency. For example, the frequency of the internal clock 101 is twice as high as that of the external clock 100. The external clock 100 is determined by the specification of a apparatus for generating the external clock 100. Besides, the resistance 1 needs not to be provided on purpose since an internal resistance in a wiring path is sufficient. Further, it is impossible to provide the amplitude-conversion circuit 108 between the VCO 106 and the internal clock buffer 107. That is, since the amplitude of the output of the amplitude-conversion circuit 108 is small, it oscillates at an amplitude on a level lower than the CMOS level. As a result, there is such a problem that, the internal clock buffer 107 cannot detect the clock because the internal clock buffer 107 is formed of a CMOS circuit.

What is claimed is:

1. A clock generator comprising:

a first buffer receiving a first clock;

a second buffer receiving a second clock having an amplitude different from that of said first clock;

a phase comparator comprising phases between an output of said first buffer and an output of said second buffer; and an equalizing means coupled to said first buffer and coupled to said phase comparator, said equalizing means for equalizing a delay time of said first buffer to a delay time of said second buffer.

2. The clock generator as claimed in claim 1, wherein said means for equalizing comprises an amplitude conversion circuit substantially equalizing the amplitude of said first clock to that of said second clock.

3. The clock generator as claimed in claim 2, wherein said amplitude conversion circuit has a first resistance and a second resistance provided in series between a first power supply voltage and a second power supply voltage to resistance-divide a voltage of said first clock.

4. A clock generator comprising:
   a first buffer having a delay time during which the first buffer converts a first clock having a first amplitude to said first clock having a second amplitude;
   a second buffer having a second delay time during which said second buffer converts a second clock having a third amplitude to said second clock having said second amplitude,
   a phase comparator comparing phases between said first clock having said second amplitude and said second clock having said second amplirude; and
   an amplitude conversion circuit having a third delay time during which said amplitude conversion circuit converts said second clock having said second amplitude to said second clock having third amplitude, said third delay time being such that addition of said second delay time of said second buffer and said third delay time of said amplitude conversion circuit is substantially equal to said first delay time of said first buffer.

5. The clock generator as claimed in claim 4, wherein said amplitude conversion circuit substantially equalizes said third amplitude of said second clock to said first amplitude of said first clock.

6. The clock generator as claimed in claim 5, wherein said amplitude conversion circuit has a first resistance and a second resistance provided in series between a first power supply voltage and a second power supply voltage to resistance-divide a voltage of said second clock having said second amplitude.

7. The clock generator as claimed in claim 4, wherein said amplitude conversion circuit has a first resistance and a second resistance provided in series between a first power supply voltage and a second power supply voltage to resistance-divide a voltage of said second clock having said second amplitude.

8. A clock generator comprising:
   a first buffer having a first delay time during which said first buffer converts a first clock having a first amplitude to said first clock having a second amplitude;
   a second buffer having a second delay time during which said second buffer converts a second clock having a third amplitude to said second clock having said second amplitude;
   a phase comparator comparing phases between said first clock having said second amplitude and said second clock having said second amplitude and generating a control pulse based on the phase difference of said first clock and said second clock;
   a loop filter generating a control voltage based on said control pulse;
   a voltage-controlled oscillator producing said second clock having said second amplitude in accordance with said control voltage;
   a clock buffer amplifying said second clock having said second amplitude outputted from said voltage-controlled oscillator to drive a circuit; and
   amplitude conversion circuit converting said second clock having said second amplitude to said second clock having said third amplitude.

9. The clock generator as claimed in claim 8, wherein said amplitude conversion circuit has a third delay time during which said amplitude conversion circuit converts said second clock having said second amplitude to said second clock having said third amplitude, said third delay time being such that addition of said second delay time of said second buffer and said third delay time of said amplitude conversion circuit is substantially equal to said first delay time of said first buffer.

10. The clock generator as claimed in claim 9, wherein said amplitude conversion circuit has a first resistance and a second resistance provided in series between a power supply voltage and a ground voltage and resistance-divides a voltage of said second clock with said first and said second resistances so that said third amplitude of said second clock is substantially equal to said first amplitude of said first clock.

11. The clock generator as claimed in claim 8, wherein said amplitude conversion circuit has a first resistance and a second resistance provided in series between a power supply voltage and a ground voltage and resistance-divides a voltage of said second clock with said first and said second resistances so that said third amplitude of said second clock is substaintially equal to said first amplitude of said first clock.

* * * * *